United States Patent

[11] 3,617,921

[72] Inventor William I. Smith
Palmyra, N.J.
[21] Appl. No. 28,486
[22] Filed Apr. 14, 1970
[45] Patented Nov. 2, 1971
[73] Assignee The United States of America as represented by the Secretary of the Air Force

[54] SYNCHRONOUS FERRITE TUNER
1 Claim, 1 Drawing Fig.

[52] U.S. Cl. .......... 330/207, 330/124, 330/155, 330/165, 334/12, 334/71
[51] Int. Cl. .......... H03j 3/16, H03j 3/24, H03f 1/46
[50] Field of Search .......... 334/4, 11–14, 71, 16; 333/24 G; 331/36 L, 105, 169–171, 181, 168; 330/165, 169, 155; 325/383, 454, 462, 463, 485

[56] References Cited
UNITED STATES PATENTS

| | | | |
|---|---|---|---|
| 2,159,754 | 5/1939 | Wohlfarth .......... | 334/12 |
| 2,997,584 | 8/1961 | Querfurth .......... | 334/12 |
| 3,430,175 | 2/1969 | Matsuoka et al. .......... | 334/12 X |

*Primary Examiner*—Herman Karl Saalbach
*Assistant Examiner*—Paul L. Gensler
*Attorneys*—Harry A. Herbert, Jr. and George Fine

ABSTRACT: A synchronous ferrite tuner for an RF amplifier in which tuning is performed by applying a single DC control current to set simultaneously the inductance of ferrite cores in both grid and plate circuit resonators.

PATENTED NOV 2 1971
3,617,921
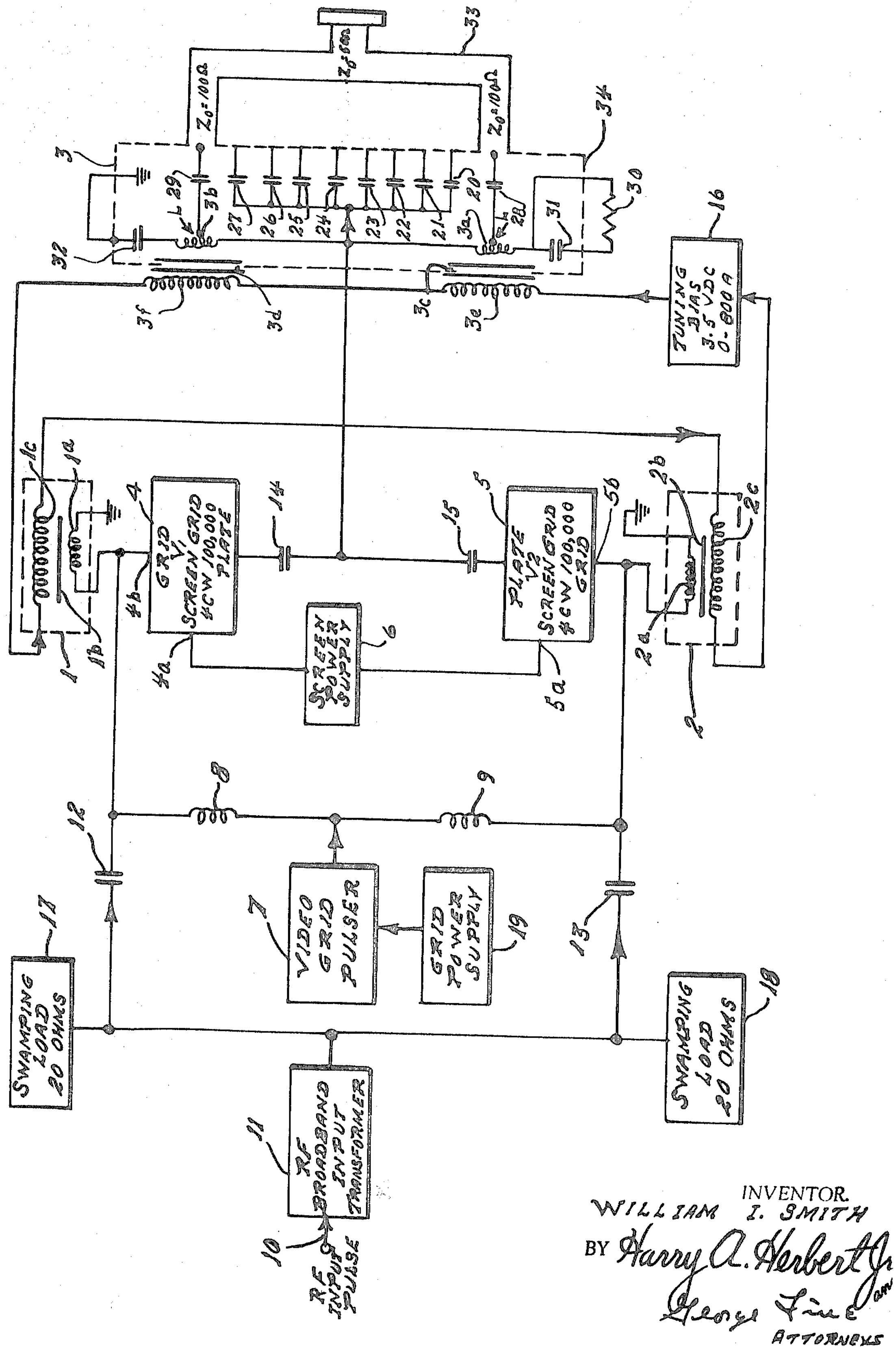
INVENTOR.
WILLIAM I. SMITH
BY Harry A. Herbert Jr.
George Fine
ATTORNEYS

SYNCHRONOUS FERRITE TUNER

BACKGROUND OF THE INVENTION

This invention relates to tuning a multiplicity of resonant circuits simultaneously and more particularly to a synchronous ferrite tuner in which tuning is accomplished by applying a single DC control current to simultaneously control the inductances of ferrite cores in a multiplicity of resonant circuits.

In the prior art, it is known that a control current can be used to set the incremental permeability of a ferrite core inductor. This principle has been used in resonators for particle accelerators, and in design of radio frequency amplifiers. However, in certain instances, it was found desirable to simultaneously tune two ferrite-loaded resonant circuits for example, the plate and grid resonator circuits of a high-power RF amplifier by the use of a control current.

This simultaneous tuning resulted in an interference with the RF energy being turned in the circuits. Still further, there existed the problems of excessive power and excessive numbers of control circuits required.

The present invention provides a tuner wherein a single control current is made to tune simultaneously a multiplicity of ferrite-loaded resonant circuits while remaining decoupled from the RF energy being tuned in the resonant circuits. Since the control current is isolated from the RF energy in each circuit, the control windings of the resonant circuits operating at different RF energy levels can be series-connected to tune from a single current source.

An object of this invention is to provide a synchronous ferrite tuner for electronically and simultaneously resonating a multiplicity of circuits, each having ferrite core inductor.

Another object of the present invention is to provide a tuner for electronically and simultaneously tuning at high speed a multiplicity of resonant circuits, each of the circuits including a ferrite core inductor and a winding with the windings connected in a series arrangement for application of a single control current thereto.

SUMMARY OF THE INVENTION

A synchronous ferrite tuner is provided which electronically and simultaneously tunes at high speed a multiplicity of resonant circuits. Two or more circuits, each including a ferrite core inductor, are resonated simultaneously with the same control current source. For example, the plate and grid resonator circuits of a high-power RF amplifier can be simultaneously tuned by a single control current thus providing a frequency agile amplifier. Each of the ferrite core inductors includes a winding. The windings are series connected and a single DC control current is applied thereto to vary the permeability of the associated ferrite and thereby simultaneously change the inductances of the resonant circuits.

The invention also permits all the circuits therein to resonate over the same frequency range simultaneously at a frequency controlled by the tuner current. Tracking is accomplished by the following four requirements. The tuner control windings are series-connected. The same ferrite material is employed in each resonator. The ratio N/D of all resonators being simultaneously tuned are equal, where N is the number of turns on the tuner winding and D is the mean diameter of the ferrite cores used. The circuit capacitances are matched to the inductance value in each resonator so that at one extreme of the tuning range the resonators are all at the same frequency. With the above requirements fulfilled, the inductance values will change in the same ratio so that the circuit resonant frequencies will track as the tuner control current is charged.

DESCRIPTION OF THE DRAWING

The single figure shows partly in schematic and partly in block diagram form a preferred embodiment of the invention.

DESCRIPTION OF THE PREFERRED EMBODIMENT

Now referring to the single figure, there is shown an RF power amplifier including tunable grid resonators 1 and 2 and tunable plate resonator 3. There is provided two vacuum tubes $V_1$ and $V_2$ and also shown as tubes 4 and 5, respectively. The tubes are of the type known as 4CW100000. Tubes 4 and 5 are provided with power supply 6 which delivers the requisite power to screen grids *4a* and *5a*, respectively. During interpulse time the tubes are biased to cut off 20 to start pulse operation tubes 4 and 5 are brought to class B operating point by video grid pulser 7 by way of radio frequency chokes 8 and 9, respectively. Video grid pulser 7 is connected to grid power supply 19. Synchronously, an RF input pulse received by way of terminal 10 and RF broad band input transformer 11 is coupled by capacitors 12 and 13 to the paralleled tube grids *4b* and *5b*, respectively. RF broadband input transformer 11 also supplies an impedance match for swamping loads 17 and 18. The grid circuit input capacitance of each of tubes 4 and 5 is resonated with tunable ferrite resonators 1 and 2, respectively. The swamping stabilizes the amplifier and broadens the input circuit bandwidth. As a result, the amplifier is free from self and parasitic oscillations and the grid circuit tuning is broad enough so that tracking between grid resonators 1, 2 and plate resonator 3 is not a problems. The swamping fixes the gain at 13 db.

The aforementioned tunable grid ferrite resonators 1 and 2 are utilized to resonate with the grid input capacitance of tubes 4 and 5, respectively. Tunable ferrite resonator 1 is comprised of inductance *1a*, ferrite core *1b*, and control winding *1c*. Tunable ferrite resonator 2 is comprised of inductance *2a*, ferrite core *2b* and control winding *2c*. The magnitude of inductances *1a* and *2a* are varied until they tune out the input grid capacitance of tubes 4 and 5, respectively. The manner of varying the inductance will be discussed in detail hereinafter.

Plate resonator 3 is comprised of ferrite inductors *3a* and *3b* receiving the RF output of tubes 4 and 5 by way of capacitors 14 and 15, respectively. Each of the inductors makes up one end of a symmetrical resonator. These inductors appear in parallel in the RF circuit. Each is center tapped at a 100-ohm impedance level. The inductors are resonant with the combination of eight capacitors 20–27, the distributed capacitance of the resonator structure, and 4 and 5 tubes output capacitances. When load current is drawn at the taps, additional reactive volt amperes are set up in the inductances *3a*, *3b*. These are resonated out by capacitors 28 and 29, respectively. The circuit resonance is thus made independent of resistive loading. Resistor *3o* bleeds of any leakage current so that it cannot fracture low-voltage tuning blocker capacitors 31 and 32.

Now referring in detail to the output from resonator 3, uniform matching at very low Q-values is provided. The tapped inductors *3a*, *3b* represent the symmetrical halves of the resonator. The taps are placed at 100-ohm impedance levels on the ferrite inductors L. 100/100/50 ohm Tee 33 combines the output signals received by way of capacitors 28 and 29. When load current is drawn, additional reactive volt amperes are set up in the inductors. These are resonated out by capacitors 20–27. This resonant relationship holds over the band with ferrite tuning. In this manner, the circuit resonance is made independent of resistive loading at the tap. A second result is that the impedance transfer ratio becomes independent of load resistance, and therefore independent of circuit Q. Even though low-circuit Q-values are encountered at the lower band limit, the impedance match is made constant and independent of frequency. The matching characteristic is broad and uncritical since the transformation bandwidth is large.

Referring in detail to tunable resonators 1, 2 and 3 they may also be referred to as ferrite tuners. Tunable grid resonator 1 is comprised of ferrite inductor *1a*, ferrite core *1b*, and control winding *1c*. Tunable grid resonator 2 is comprised of ferrite inductor *2a*, ferrite core *2b*, and control winding *2c*. Tunable plate resonator 3 is comprised of ferrite inductors 3*a*, 3*b*, ferrite cores 3*c*, 3*d*; and control windings 3*e*, 3*f*. Control windings 1*c*, 2*c*, and 3*e*, 3*f* are connected in a series arrangement and receive a single control current signal from variable tuning bias current source 16. The aforementioned series arrangement in combination with a single variable current signal permits electronic, simultaneous, and high-speed tuning of the grid and plate resonant circuits. This, of course, is accomplished by changing the DC current signal to vary the permeability of the ferrite cores and thereby the inductances of the RF amplifier tank (resonant) circuits.

In order to provide exact tracking over the desired frequency range where the above-mentioned multiplicity of resonators were utilized, the following four requirements were observed. The ferrite tuner control windings of tunable ferrite resonators 1, 2, and 3 were series connected. The same ferrite materials were used for all the ferrite cores. The ratio N/D of all resonators being simultaneously tuned were made equal, where N is the number of turns on the tuner control winding and D is the mean diameter of the ferrite cores used. The circuit capacitances were matched to the inductance value in each resonator so that at one extreme of the tuning range the resonators were all at the same frequency. With the following four requirements fulfilled, the inductance values change in the same ratio so that the circuit resonant frequencies will track as the ferrite tuner control current signal is charged.

It is emphasized that an embodiment including an RF power amplifier is described. However, the essence of the invention is comprised of resonating two or more circuits with ferrite core inductors with the same control current signal. For example, the plate and grid resonator circuits. It is clear that all the circuits required in conventional amplifier stages can be controlled in a like manner. The present invention, thus, describes how a control current signal can be made to tune ferrite-loaded circuits electronically and simultaneously while remaining decoupled from the RF energy being tuned in the circuits. Since the control current signal is isolated from the RF energy in each circuit, the control windings of circuits operating at different RF energy levels can be series-connected to tune from a single current source.

I claim:

1. A synchronous ferrite tuner apparatus for an RF amplifier comprising a pair of output tubes for said RF amplifier, each of said tubes including a grid and plate resonant circuit, a ferrite core tuner for each of said grid and plate resonant circuits, each of said ferrite core tuners including a ferrite core inductor integrated with its associated resonant circuit, a ferrite core, and an associated control winding for said ferrite core, and a single variable DC current source, said single DC current source and said control windings being serially connected to form a single loop to permit all of said grid and plate resonant circuits to be electronically and simultaneously tuned by varying said DC current source.

* * * * *